United States Patent
Kanno

(10) Patent No.: US 6,411,141 B1
(45) Date of Patent: Jun. 25, 2002

(54) PLL CIRCUIT

(75) Inventor: Hiroshi Kanno, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/285,073

(22) Filed: Apr. 2, 1999

(30) Foreign Application Priority Data

Apr. 2, 1998 (JP) ............................................. 10-090146

(51) Int. Cl.$^7$ ............................ H03L 7/095; H03L 7/06
(52) U.S. Cl. ...................... 327/156; 327/159; 331/17; 331/DIG. 2
(58) Field of Search ................................. 327/156, 147, 327/2, 3, 12; 331/25, DIG. 2, 17; 375/108, 120

(56) References Cited

U.S. PATENT DOCUMENTS 5,260,979 A * 11/1993 Parker et al. ............... 375/108
5,680,076 A * 10/1997 Kelkar et al. ................ 331/25

FOREIGN PATENT DOCUMENTS

| JP | 55-37771 | 3/1980 |
| JP | 3-206725 | 9/1991 |
| JP | 7-15325 | 1/1995 |
| JP | 7-38427 | 2/1995 |
| JP | 8-316832 | 11/1996 |

* cited by examiner

Primary Examiner—Dinh T. Le
(74) Attorney, Agent, or Firm—Young & Thompson

(57) ABSTRACT

A phase lock signal generation unit includes a phase difference signal generation unit for generating a phase difference signal between a reference clock signal and an internal clock signal; a phase shift detection unit for generating a signal indicating a release of a phase lock signal LOCK when phase shifts occur continuously two times in predetermined intervals in a phase different signal; and a wait time count unit which is controlled by an output from the phase shift detection unit, and releases the phase lock signal.

10 Claims, 5 Drawing Sheets

PLL CIRCUIT

BACKGROUND OF THE INVENTION

1. Field of the Invention

The present invention relates to a phase locked loop circuit (PLL circuit), and more specifically to the structure of the phase lock signal generation unit for the PLL circuit.

2. Description of the Prior Art

A PLL circuit is mounted in, for example, a semiconductor device, and generates from an externally input reference clock signal having a reference frequency an internal clock signal which is synchronous with the reference clock signal and has a frequency at a specific ratio to the reference frequency. When electric power is applied to the PLL circuit, it starts its operation. When the transient period is over, and a predetermined internal clock signal synchronous with a reference clock signal is obtained, a phase synchronous signal (phase lock signal) indicating the situation is issued. Each function block which is provided in a semiconductor device and uses the internal clock signal starts processing signals using the internal clock signal after receipt of the phase lock signal.

FIG. 5 shows the conventional PLL circuit described in the Provisional Publication of the Japanese Patent Application Laid-Open No. 8-316832. The PLL circuit includes an internal clock signal generation unit 31 and a phase lock signal generation unit 38, compares using a phase comparison circuit 32 the phase of an externally input reference clock signal RCLK with the phase of a comparison clock signal VCLK generated by an internal clock signal generation unit 30, and generates a phase lock signal LOCK from a phase lock signal generation unit 38 if the phase difference between the reference clock signal RCLK and the internal clock signal ICLK is within a predetermined range.

In the internal clock signal generation unit 31, an UP output and a DOWN output which are a pair of outputs from the phase comparison circuit 32 are input to a charge pump circuit 33, and control the output potential of the charge pump circuit 33. The output from the charge pump circuit 33 is input to a voltage control oscillator (VCO) 35 through a low pass filter (LPF) 34, and controls the frequency of the internal clock signal ICLK which is an output therefrom. The internal clock signal ICLK is counted by a counter 36 containing a predetermined set value. The count result is fed back to the phase comparator 32 as a comparison clock signal. The set value of the counter 36 is set based on the ratio of the reference frequency to the frequency of the internal clock signal ICLK such that the value of the reference frequency equals the value of the frequency of the comparison clock signal VCLK.

Immediately after the electric power is applied to the PLL circuit, the reference clock signal RCLK is a synchronous with the internal clock signal ICLK, and the PLL circuit starts its operation for synchronization. The phase comparator 32 compares the rise phase RH of the reference clock signal RCLK with the rise phase VH of the comparison clock signal VCLK. If the rise phase RH advances, the output UP and the output DOWN are set to L to increase the output from the charge pump circuit 33, and the frequency of the comparison clock signal VCLK. If the rise phase RH is behind, the output UP and the output DOWN are set to H to lower the output from the charge pump circuit 33 and the frequency of the comparison clock signal VCLK. Thus, a synchronizing operation is performed to make zero phase difference between the signals. When both signals are synchronous with each other, and the phase difference becomes zero, the phase comparator 32 sets the output UP to H, and the output DOWN to L, to fix the output from the charge pump circuit 33 as is. Thus, the clock signals RCLK and VCLK can be synchronous with each other.

In the phase lock signal generation unit 38, when the output UP and the output DOWN of the phase comparator 32 indicate H and L respectively, the output from an AND gate 71 indicates H, and the output passes through a flip-flop circuit 72 having flip-flops FF1 through FF3 serially connected to multiple stages. If the output from the phase comparator 32 enters a stable state and keeps the state for a predetermined period, then the output from all flip-flops FF1 through FF3 is H. Therefore, the output from an AND gate 73 indicates H, and a phase lock signal LOCK is output. Each function lock using the internal clock signal ICLK starts its operation when the phase lock signal is detected.

In the conventional PLL circuit having the above described phase lock signal generation unit, the phase lock signal LOCK is not output until the synchronization between the reference clock signal RCLK and the internal clock signal ICLK continues for a predetermined period as a stable internal clock signal ICLK. The internal clock signal ICLK is often used in an integrated circuit other than the generated integrated circuit. In this case, the internal clock signal has a length covering a plurality of integrated circuits. Such a long clock signal wiring is subject to an influence of the noise from a clock signal wiring, etc. in another system, thereby generating a signal error such as the delayed rise of an internal clock signal. In this case, an asynchronous phase arises only in an output from the phase comparator 32 even though the PLL circuit actually maintains normal synchronization. Such asynchronization can also be caused by the fluctuation of the voltage of power supply.

If an output from the phase comparator becomes asynchronous only for a moment, then the phase lock signal generation unit 38 first releases the phase lock signal LOCK, and then generates again a phase lock signal after stable phase synchronization continues for a predetermined period. During the period, each function block stops its operation and waits for the generation of a phase lock signal even if a stable internal clock signal ICLK has actually been generated. During the function block stop period, the integrated circuit does not proceed with its signal process, thereby lowering the throughput of the signal process.

SUMMARY OF THE INVENTION

It is therefore an object to provide a PLL circuit which does not reduce the throughput in the signal process in a function block by avoiding a long stop of the operations of the function block without releasing a phase lock signal as long as the PLL circuit maintains normal synchronization even if a signal error has occurred from noise for a short time in an output from a phase comparator.

The PLL circuit according to the present invention generates an internal clock signal having a frequency at a specific ratio to the reference frequency according to a reference clock signal having the reference frequency, and includes: a phase shift detection unit for comparing at predetermined time intervals the phase of the reference clock signal with the phase of the internal clock signal or a comparison clock signal synchronous with the internal clock signal, for generating a phase matching signal when a comparison result indicates matching, and for generating a phase shift signal when the comparison result indicates non-matching; and a phase lock signal generation means for generating a phase lock signal corresponding to the phase matching signal, and releasing the phase lock signal when the phase shift signal is continuously generated plural times.

Since the PLL circuit according to the present invention does not release a phase lock signal unless the phase shift continuously occurs plural times, the undesired stop in the signal process of a function block can be prevented from being made by simple and small, but not serious noise to the integrated circuit.

It is desired that the phase lock signal generation means generates the phase lock signal when a predetermined time passes after the phase matching signal has been generated. In this case, even if the phase synchronization once occurs after the electric power is applied, the phase synchronization is nullified by a subsequent rebounding, thereby avoiding an undesired operation in the function.

It is desired that the phase shift detection unit detects a plurality of continuous phase shifts according to a plurality of phase shift detection clock signals activated at predetermined time intervals. Thus, an occurrence of a plurality of continuous phase shifts can be detected without fail.

It is desired that the predetermined time intervals are obtained based on the clock cycle of the reference clock signal or the internal clock signal. In this case, a complicated circuit using other clock signals can be avoided.

BRIEF DESCRIPTION OF THE DRAWINGS

This above-mentioned and other objects, features and advantages of this invention will become more apparent by reference to the following detailed description of the invention taken in conjunction with the accompanying drawings, wherein.

DETAILED DESCRIPTION OF THE PREFERRED EMBODIMENTS

Figure 1:
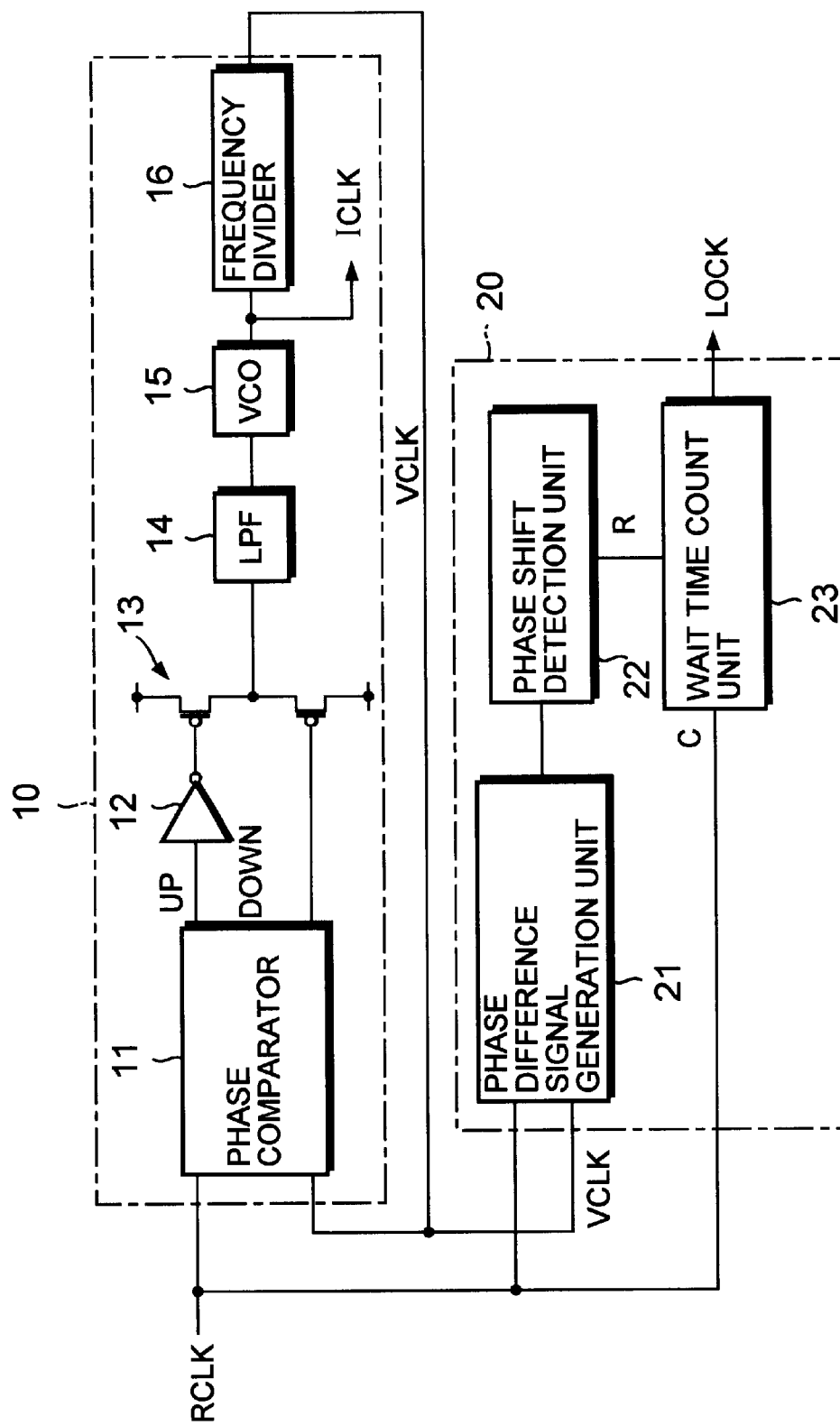
FIG. 1 is a block diagram of the PLL circuit according to an embodiment of the present invention.

The present invention is described below based on preferred embodiments by referring to the attached drawings. FIG. 1 is a block diagram of the configuration of the PLL circuit according to an embodiment of the present invention. The PLL circuit according to the present embodiment comprises an internal clock signal generation unit 10 and a phase lock signal generation unit 20.

The internal clock signal generation unit 10 comprises a phase comparator 11 for comparing the reference phase of the reference clock signal RCLK with the phase of the comparison clock signal VCLK, and outputting an H signal or an L signal to an UP output and a DOWN output; an inverter 12 for inverting the UP output of the phase comparator 11; a charge pump 13 having a p channel transistor and an n channel transistor to be respectively controlled by the output from the inverter 12 and the DOWN output; a low-pass filter (LPF) 14 for passing the low frequency component of the output from the charge pump 13; a voltage control oscillator (VCO) 15 in which the frequency of the output signal is controlled by the output from the low-pass filter 14; and a frequency division circuit 16 for dividing the output signal from the VCO 15, generating a comparison clock signal VCLK, and feeding it back to the phase comparator 11. The output signal from the VCO 15 is used as an internal clock signal ICLK in the integrated circuit. According to the present embodiment, the UP output and the DOWN output from the phase comparator are active signals. When the UP output is active, the output voltage of the charge pump rises. When the DOWN output is active, the output voltage of the charge pump drops.

The phase lock signal generation unit 20 comprises: a phase difference signal generation unit 21 for comparing the fall phases between the reference clock signal RCLK and the comparison clock signal VCLK, and generating a signal corresponding to the phase shift; a phase shift detection unit 22 for processing a signal from the phase difference signal generation unit 21, and counting a predetermined number of phase shift pulses; and a wait time count unit (wait counter unit) 23 which is controlled by an output from the phase shift detection unit 22 and generates a phase lock signal LOCK when a predetermined time passes from the point at which the phase shift indicates zero. The phase difference signal generation unit 21 is a well-known circuit designed by, for example, combining logical circuits, and generates a pulse rising for a fall time shift if there is a time difference between the fall of the reference clock and the fall of the comparison clock.

Figure 2:
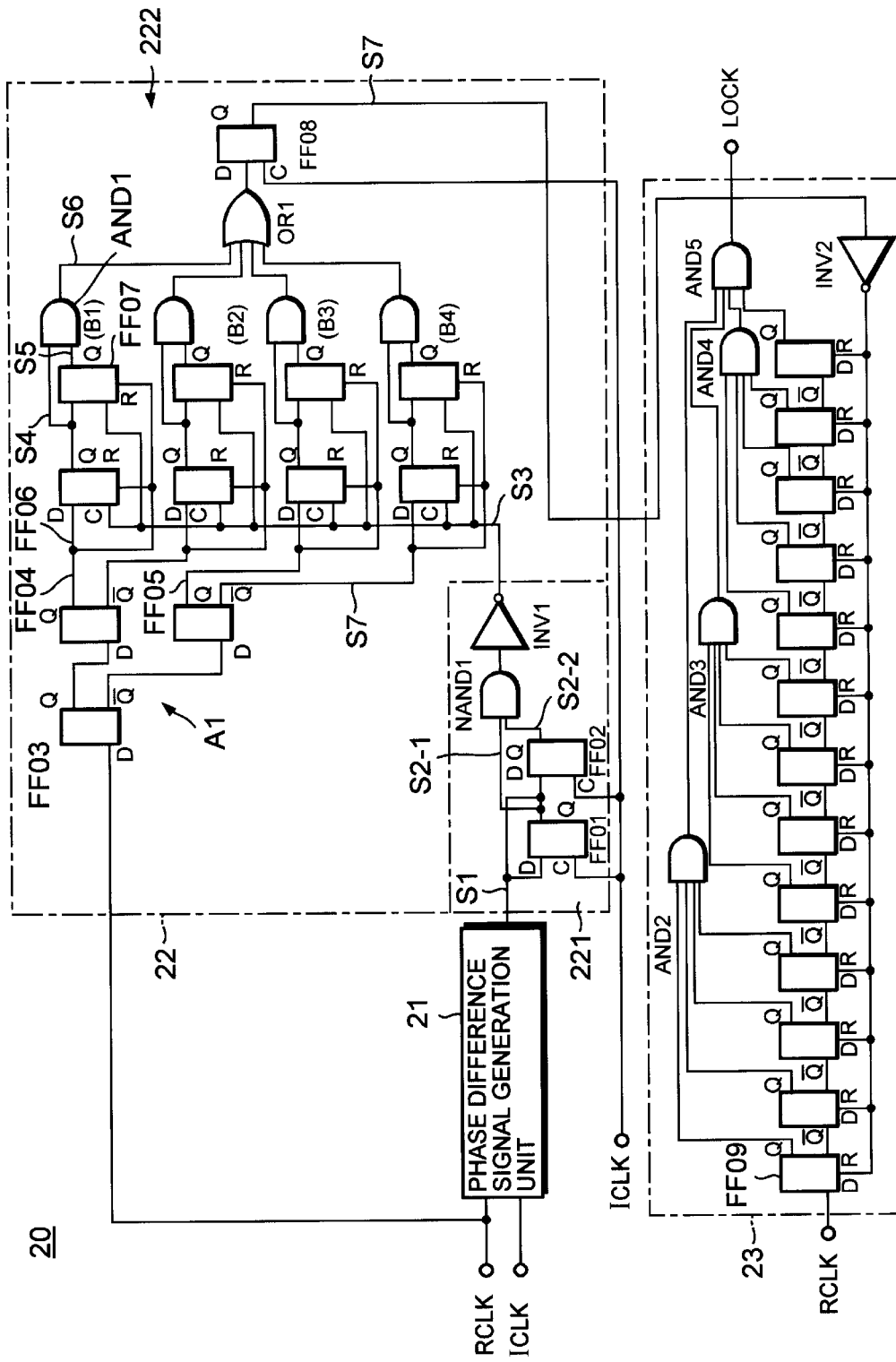
FIG. 2 is a block diagram of the details of the phase lock signal generation unit shown in FIG. 1.

FIG. 2 shows the details of the phase shift detection unit 22 and the wait time count unit 23 of the phase lock signal generation unit 20. The phase shift detection unit 22 comprises a phase shift determination unit 221 which receives an output from the phase difference signal generation unit 21, and determines the existence of a phase shift longer than a predetermined time; and a continuous phase shift detection unit 222 for counting the occurrences of phase shifts, and outputs an active ("H") signal when phase shifts occur for a number of times larger than a predetermined value. The phase shift determination unit 221 comprises a first flip-flop FF01 and a second flip-flop FF02 for receiving an output from the phase difference signal generation unit 21 as data, and the internal clock signal ICLK as a clock.

The first flip-flop FF01 latches input data at the rise of an input clock. The second flip-flop FF02 latches input data at the fall of an input clock. The flip-flops provide the outputs for a NAND gate NAND 1. The output from the NAND 1 is provided for the continuous phase shift detection unit 222 through an inverter INV 1. The phase shift determination unit 221 detects whether or not the pulse width of the output pulse from the phase difference signal generation unit 21 is larger than the clock width of the internal clock signal, and provides an information pulse for the continuous phase shift detection unit 222 at the next stage if phase shifts have occurred for the times larger than a predetermined value. Thus, the phase shift determination unit 221 cuts a phase shift when it is detected by the phase difference signal generation unit 21 between the reference clock signal RCLK and the comparison clock signal VCLK, and when the detected phase shift is smaller than the clock width of the internal clock signal. That is, since the entire circuit operation becomes unstable if all small shifts are recognized, they can be removed. As a result, the phase shift determination unit 221 is not required when those small shifts are to be recognized. In this case, the output from the phase difference signal generation unit 21 is provided for the continuous phase shift detection unit 222.

The continuous phase shift detection unit 222 comprises a phase shift detection clock signal generation unit A1 which comprises three flip-flops FF03 through FF05, and generates four phases of phase shift detection clock signals TCLK1 through TCLK4 from the reference clock signal RCLK; and four detection blocks B1 through B4 each comprising two flip-flops FF06 and FF07 and the AND gate AND 1, and detecting a phase shift in the active period of a corresponding phase shift detection clock signal. The continuous phase shift detection unit 222 is designed to detect whether or not the pulse detected by the phase shift determination unit 221 has continuously been generated two times, that is, whether or not the pulse is caused by noise, or whether or not the asynchronization has actually occurred.

Figure 3:
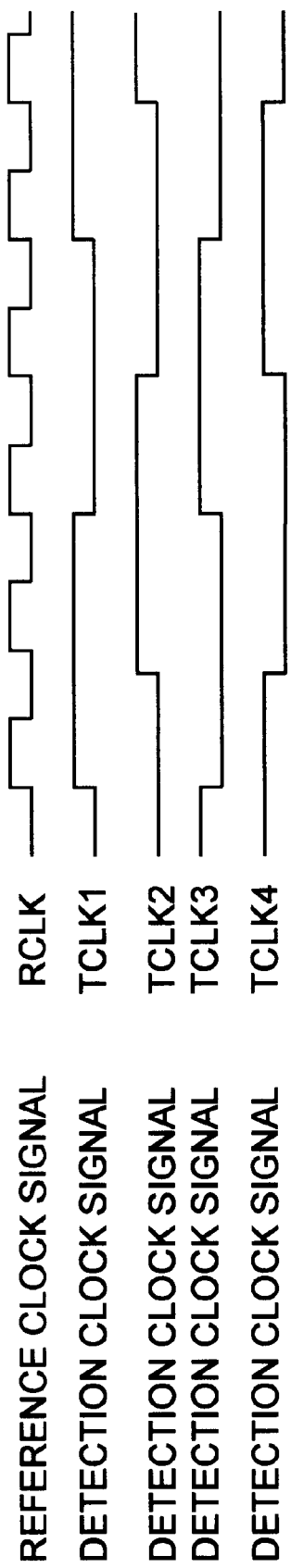
FIG. 3 is a timing chart of the continuous phase shift detection clock signal.

FIG. 3 is a timing chart showing the reference clock signal RCLK and the phase shift detection clock signals TCLK1 through TCLK4. Each phase shift detection clock signal has a cycle of four continuous reference clock signals RCLK, and indicates an H level on two clock cycles of the reference clock with one cycle of the reference clock signal RCLK sequentially shifted. Each of the phase shift detection clock signals TCLK1 through TCLK4 becomes active at the H level, and a corresponding detection block generates a continuous phase shift detection signal when two continuous phase shifts occur in the active period.

Back in FIG. 2, the output from each of the detection blocks B1 through B4 is input to an OR gate OR1. The output from the OR 1 is latched by a flip-flop FF08 which receives an internal clock signal ICLK as an input clock, and is then provided as an output from the phase shift detection unit 22 for the wait time count unit 23.

The wait time count unit 23 comprises an inverter INV 2, a plurality of (for example, 13) serially connected flip-flops FF09, and four AND gates AND 2 through AND 5 for receiving signals from the flip-flops FF09. The flip-flop at the first stage receives a reference clock signal RCLK, and the subsequent flip-flops at and after the second stages receive inverse output signals/Q (/indicates 'inverse') of the previous flip-flops, and transfer their own inverse output signals/Q to the subsequent flip-flops. The output from the phase shift detection unit 22 is provided as a reset input for each flip-flop through the INV 2. The signal Q of each flip-flop FF09 is sequentially used in computing the logical sum in each of the AND gates AND 2 through AND 5. When the outputs from all flip-flops indicate H, the phase lock signal LOCK indicates "H," and is then output from the phase lock signal generation unit 20.

Described below is the entire operation of the above described PLL circuit. In FIG. 1, when the electric power is applied, the internal clock signal generation unit 10 operates, the feedback control is performed such that the phases match between the reference clock signal RCLK and the comparison clock signal VCLK, and the internal clock signal ICOK becomes synchronous with the reference clock signal RCLK. At this time, in the phase lock signal generation unit 20, the output from the phase shift detection unit 22 which receives the output from the phase difference signal generation unit 21 indicates "H." After the wait time count unit 23 counts a predetermined number of clocks of the reference clock signal RCLK, the phase lock signal LOCK is set at the "H" level. At this time, note that the LOCK signal has not been released. Thus, the asynchronization caused by the rebounding which occurs immediately after the phase synchronization can be avoided.

Each function block in the semiconductor device starts processing signals according to the phase lock signal. Afterwards, when the asynchronization of the internal clock signal ICLK occurs for any reason, it is detected by the phase shift detection unit 22, and the phase lock signal LOCK is released through the wait time count unit 23. Thus, the operation of each function block is temporarily stopped until the phase lock signal is generated again.

Figure 4:
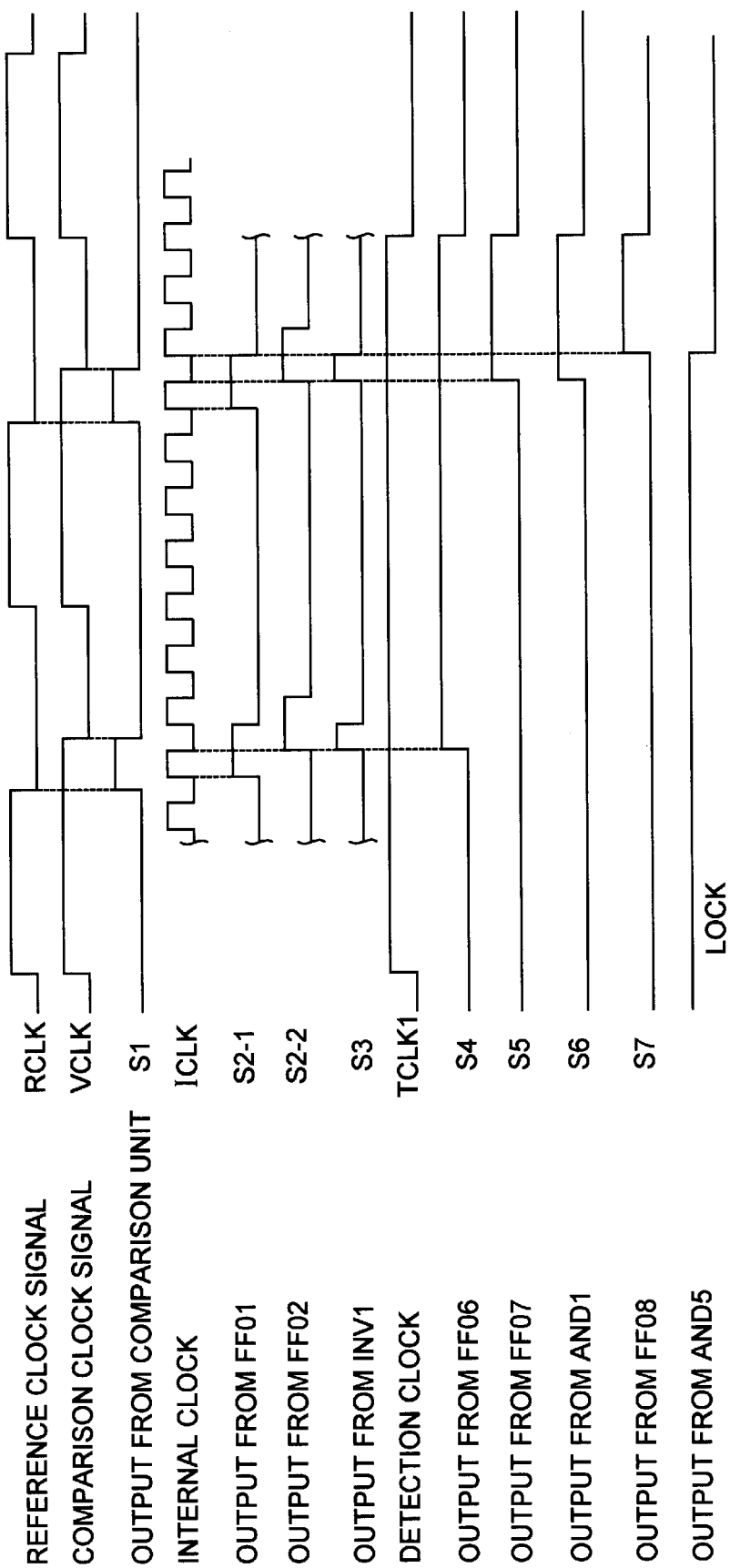
FIG. 4 is a timing chart of the internal signal of the phase shift detection unit.
Figure 5:
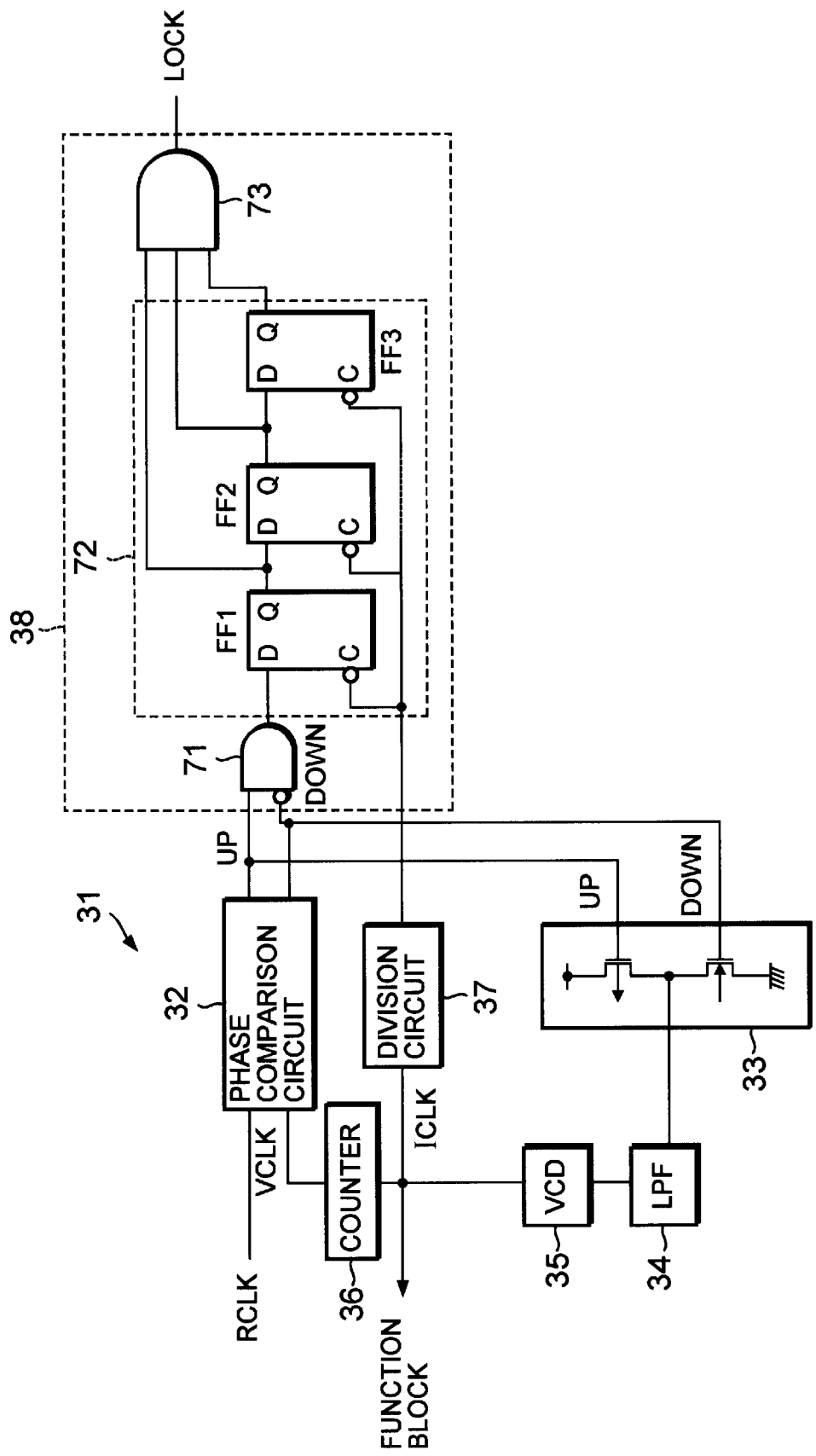
FIG. 5 is a block diagram of the conventional PLL circuit.

FIG. 4 is a timing chart showing the signal in the phase shift detection unit 22. It shows the reference clock signal RCLK, and the comparison clock signal VCLK which is an output from the frequency division circuit 16, and also shows an example of the fall phase of the VCLK behind the fall phase of the RCLK. The operation of the phase shift detection unit 22 is described below by referring to FIGS. 4 and 2.

The output S1 from the phase difference signal generation unit 21 rises after the RCLK indicates "L," and outputs "H" until the VCLK indicates "L." In the phase shift determination unit 221 of the phase shift detection unit 22, first and second flip-flops FF01 and FF02 latch the outputs from the phase difference signal generation unit 21 at the rise time and the fall time of the internal clock signal ICLK having a clock pulse of, for example, 2 ns. When both outputs S2-1 and S2-2 from the first flip-flop FF01 and the second flip-flop FF02 indicate "H," the phase shift determination unit 221 determines that the internal clock signal ICLK indicates a phase shift which has not been caused by a simple or temporary noise, and sets the output S3 of the INV 1 to "H." If a signal informing that phase shifts have continuously occurred two times is detected when each of the detection blocks B1 through B4 is active, then the continuous phase shift detection unit 222 determines that asynchronization has occurred.

In the example shown in FIG. 4, when the phase shift detection clock signal TCLK 1 provided for the first detection block B1 is active, the state H indicating two phase shifts in the output S3 of the INV occurs. The first phase shift is detected by latching the phase shift detection clock signal TCLK 1 by the FF06 of the first detection block B1, and the output S4 is set to "H." The second phase shift is detected by the FF07 through the FF06, and the output S5 of the FF07 is set to "H." Thus, the output S6 of the AND 1 indicates "H." The flip-flop FF08 receives the "H" through the OR1, sets the output S7 to "H," and resets all flip-flops FF09 of the wait time count unit 23 through the INV 2. Thus, the phase lock signal LOCK indicates "L," and notifies each function block of the phase asynchronization.

Once the asynchronization occurs, it continues until a specific period has passed. The wait time count unit 23 counts the reference clock signals RCLK back from the beginning for recovery of synchronization, and generates the phase lock signal LOCK again after counting a predetermined number ($2^{13}$).

The wait time is, for example, $2^{13}$ (40 ns=320 μs). Immediately after the phases largely shifted between the reference clock signal RCLK and the internal clock signal ICLK have become synchronous with each other, for example, immediately after the supply of electric power, etc., the once synchronized phases often enters an asynchronous state again. This is well known as a rebounding phenomenon. The rebounding phenomenon arises normally within 320 μs. The wait time count unit 23 generates the phase lock signal LOCK after the time within which such a rebounding phenomenon can arise has passed, and can be free of generation and release of a useless phase lock signal LOCK. Therefore, the PLL circuit which slowly converges the rebounding phenomenon can be designed to set longer the time counted by the wait time count unit 23. On the other hand, the PLL circuit which quickly converges the rebounding phenomenon can be designed to set shorter the time counted by the wait time count unit 23.

According to the present embodiment, the phase lock signal is released when asynchronous phases continuously arise two times.

Conventionally, unlike the present embodiment, a phase lock signal is released by only once detecting asynchronous phases. Therefore, a phase lock signal can be released by noise entering the internal clock signal, etc. In this case, the phase synchronization cannot be attained by changing the frequencies of the internal clock signals which have been synchronous with each other. In addition, even if the synchronization has been regained according to the function of the internal clock signal generation unit 10, the phase lock signal cannot be generated until the wait time count unit 23 finishes counting a predetermined number. Accordingly, there has been the problem that the throughput in the function block operating according to the internal clock signal is reduced. According to the present embodiment, considering that there is next to impossible that noise causes asynchronization continuously two times, the phase lock signal is not released until phase shifts are continuously detected two times as described above. Therefore, a phase lock signal can be prevented from being released simply by noise, thereby avoiding the reduction of the throughput of a function block.

In the PLL circuit according to the present embodiment, a generated phase lock signal is not released until phase shift generation pulses arise continuously two times at predetermined intervals. Therefore, an instant phase shift signal caused by signal noise, etc. does not release a phase lock signal. Accordingly, a function block can be prevented from being stopped by releasing a phase lock signal and waiting for the counting by the wait time count unit 23 actually when the PLL circuit is normally operated. As a result, the reduction of the throughput of a signal process can be avoided. Thus, the longer the time of the counting by the wait time count unit 23 is set, that is, the more slowly the PLL circuit converges rebounding, the more outstanding the effect becomes.

According to the present embodiment, the continuous phase shift detection unit 222 releases a phase lock signal by detecting two continuous phase shifts. However, it can be designed to detect continuous three or four phase shifts. That is, the continuous occurrences of phase shifts for determining, not noise, but an authentic phase shift, depend on the quality of predicted noise or the feature of a predicted phase shift. However, a phase shift caused by noise can be detected only once. If a number of continuous phase shifts can be detected, a larger circuit is generated. As a result, two continuous phase shifts is appropriate as described in the present embodiment.

In the above described present embodiment, the phases are compared between the reference clock signal and the comparison clock signal. However, it is obvious that the reference clock signal can be directly compared with the internal clock signal to detect a phase shift. In addition, according to the above described present embodiment, four detection clock signals are used, but 2-phase or 3-phase detection clock signals can be used as long as asynchronization can be detected two times continuously. However, a 4-phase clock signal can be easily formed using flip-flops, can detect asynchronization two times continuously without fail, and is therefore recommendable.

As described above, when the PLL circuit according to the present invention is normally operated, a phase lock signal can be prevented from being released simply by signal noise, thereby avoiding the reduction of the throughput of a signal process.

What is claimed is:

1. A phase locked loop circuit comprising:

an internal clock generation circuit receiving a reference clock and a comparison clock to produce an internal clock in response to said reference clock and said comparison clock, said comparison clock corresponding to said internal clock; and a phase lock signal generation circuit receiving said reference clock and said comparison clock to produce a phase lock signal and to release said phase lock signal;

said phase lock signal generation circuit including a phase difference signal generation circuit outputting a phase matching signal when phases of said reference clock and said comparison clock are matching and a phase mismatching signal when phases of said reference clock and said comparison clock are mismatching, and a phase detection circuit having a plurality of signal paths each for producing a detection clock, each of said detection clocks having an activated level having different timing, at least two activated levels of said detection clocks being overlapped, each signal path detecting a plurality of said phase mismatching signals during a corresponding one of the activated detection clocks to release said phase lock signal.

2. The phase locked loop circuit as claimed in claim 1, wherein after each of said signal paths of said phase detection circuit detect said phase matching signal during a corresponding one of the activated detection clocks, said phase clock signal is produced.

3. The phase locked loop circuit as claimed in claim 1, wherein said phase detection circuit includes a phase determination circuit receiving said phase matching and mismatching signals outputted from said phase difference signal generation circuit to eliminate a signal corresponding to a phase difference between said reference clock and said comparison clock when said phase difference is smaller than a predetermined value and to output a signal corresponding said phase difference as said phase mismatching signal when said phase difference is larger than said predetermined value.

4. The phase locked loop circuit as claimed in claim 3, wherein said phase determination circuit includes a first latch circuit latching an output of said phase difference signal generation circuit in response to a rising edge of a clock pulse, a second latch circuit latching said output of said phase difference signal generation circuit in response to a falling edge of said clock pulse, and a logic circuit receiving outputs of said first and second latch circuits for outputting said phase matching and mismatching signals.

5. The phase locked loop circuit as claimed in claim 1, wherein each of the signal paths includes a first latch latching a level of a corresponding one of said detection clocks in response to said phase mismatching signal to output a first signal, a second latch latching a level of an output of said first latch in response to said phase mismatching signal to output a second signal, and a first logic circuit responding to said first and second signals for outputting a third signal, wherein said phase detection circuit includes a second logic circuit responding to one of said third signals for outputting a fourth signal, and wherein said phase detection circuit includes a count circuit which releases said phase lock pulse when said fourth signal turns to a first logic level and sets said phase lock pulse after said third signal turns to a second logic level and remains at said second logic level for plural counted clocks.

6. A phase locked loop circuit comprising:

an internal clock generation circuit having as inputs a reference clock and a comparison clock and having as an output an internal clock produced in response to said reference clock and said comparison clock; and a phase lock signal generation circuit having as inputs said reference clock and said comparison clock and producing and releasing a phase lock signal;

said phase lock signal generation circuit including a phase difference signal generation circuit outputting a phase matching signal when phases of said reference clock and said comparison clock are matching and outputting a phase mismatching signal when phases of said reference clock and said comparison clock are mismatching, and a phase detection circuit having a plurality of signal paths, each of the signal paths for producing a detection clock, each of said detection clocks having an activated level having different timing from the other detection clocks, at least two activated levels of said detection clocks being overlapped, each signal path detecting a plurality of said phase mismatching signals during a corresponding one of the activated detection clocks to cause said phase lock signal generation circuit to release said phase lock signal.

7. The phase locked loop circuit as claimed in claim 6, wherein after each of said signal paths of said phase detection circuit detect said phase matching signal during a corresponding one of the activated detection clocks, said phase clock signal is produced.

8. The phase locked loop circuit as claimed in claim 7, wherein said phase detection circuit includes a phase determination circuit receiving said phase matching and mismatching signals outputted from said phase difference signal generation circuit to eliminate a signal corresponding to a phase difference between said reference clock and said comparison clock when said phase difference is smaller than a predetermined value and to output a signal corresponding said phase difference as said phase mismatching signal when said phase difference is larger than said predetermined value.

9. The phase locked loop circuit as claimed in claim 8, wherein said phase determination circuit further comprises:

a first latch circuit latching an output of said phase difference signal generation circuit in response to a rising edge of a clock pulse;

a second latch circuit latching said output of said phase difference signal generation circuit in response to a falling edge of said clock pulse; and a logic circuit receiving outputs of said first and second latch circuits for outputting said phase matching and mismatching signals.

10. The phase locked loop circuit as claimed in claim 6, wherein, each of the signal paths includes a first latch latching a level of a corresponding one of said detection clocks in response to said phase mismatching signal to output a first signal, a second latch latching a level of an output of said first latch in response to said phase mismatching signal to output a second signal, and a first logic circuit responding to said first and second signals for outputting a third signal, said phase detection circuit includes a second logic circuit responding to one of said third signals for outputting a fourth signal, and said phase detection circuit includes a count circuit which releases said phase lock pulse when said fourth signal turns to a first logic level and sets said phase lock pulse after said third signal turns to a second logic level and plural clocks are counted while keeping said second logic level.

* * * * *